(12) United States Patent
Jung et al.

(10) Patent No.: US 11,494,636 B2
(45) Date of Patent: Nov. 8, 2022

(54) MACHINE LEARNING-BASED SEMICONDUCTOR MANUFACTURING YIELD PREDICTION SYSTEM AND METHOD

(71) Applicant: SK HOLDINGS CO., LTD., Seoul (KR)

(72) Inventors: Hang Duk Jung, Seoul (KR); Yong Sik Moon, Seongnam-si (KR); Myung Seung Son, Seoul (KR); Min Hwan Lee, Gwangju-si (KR); Jun Taek Park, Yongin-si (KR)

(73) Assignee: SK HOLDINGS CO., LTD., Seoul (KR)

( * ) Notice: Subject to any disclaimer, the term of this patent is extended or adjusted under 35 U.S.C. 154(b) by 855 days.

(21) Appl. No.: 16/347,985

(22) PCT Filed: Nov. 29, 2017

(86) PCT No.: PCT/KR2017/013764
§ 371 (c)(1),
(2) Date: May 7, 2019

(87) PCT Pub. No.: WO2018/101722
PCT Pub. Date: Jun. 7, 2018

(65) Prior Publication Data
US 2019/0286983 A1    Sep. 19, 2019

(30) Foreign Application Priority Data
Nov. 30, 2016  (KR) .................. 10-2016-0161315

(51) Int. Cl.
*H01L 21/66* (2006.01)
*G06N 3/08* (2006.01)
(Continued)

(52) U.S. Cl.
CPC ............... *G06N 3/08* (2013.01); *G05B 15/02* (2013.01); *G05B 17/02* (2013.01); *G06K 9/6256* (2013.01);
(Continued)

(58) Field of Classification Search
CPC .......... G06N 3/08; G06N 3/04; G06N 3/0445; G06N 3/0454; G05B 15/02; G05B 17/02;
(Continued)

(56) References Cited

U.S. PATENT DOCUMENTS

2009/0327173 A1   12/2009   Lee et al.
2010/0049680 A1   2/2010    Huang et al.
(Continued)

FOREIGN PATENT DOCUMENTS

JP    1991-15902 A     1/1991
JP    1993-242063 A    9/1993
(Continued)

OTHER PUBLICATIONS

Chen Junghui et al: "Optimal design using neural network and information analysis in plasma etching", Journal of Vacuum Science & B: Microelectronicsprocessing and Phenomena, American Vacuum Society, New York, NY, US, vol. 17, No. 1, Jan. 1, 1999 (Year: 1999).*

(Continued)

*Primary Examiner* — Marcos L Torres
(74) *Attorney, Agent, or Firm* — Sughrue Mion, PLLC

(57) ABSTRACT

Provided is a machine learning-based semiconductor manufacturing yield prediction system and method. A result prediction method according to an embodiment of the present invention comprises: learning different neural network models by classifying different types of data according to their types and respectively inputting the classified different types of data to the different neural network models; and (Continued)

predicting result values by classifying input data according to their types and respectively inputting the classified input data to different neural network models. Therefore, it is possible to apply different neural network models to respective data according to their types, thereby ensuring a neural network model having a structure appropriate for the characteristics of each type of data and thus accurately predicting a result value.

16 Claims, 5 Drawing Sheets

(51) Int. Cl.
G06K 9/62 (2022.01)
G06N 3/04 (2006.01)
G05B 15/02 (2006.01)
G05B 17/02 (2006.01)

(52) U.S. Cl.
CPC .............. *G06N 3/04* (2013.01); *H01L 22/12* (2013.01); *H01L 22/20* (2013.01)

(58) Field of Classification Search
CPC ....... G06K 9/6256; H01L 22/12; H01L 22/20; H01L 22/30
See application file for complete search history.

(56) References Cited

U.S. PATENT DOCUMENTS

2011/0112999 A1  5/2011  Lee et al.
2016/0110642 A1  4/2016  Matsuda et al.
2016/0148850 A1* 5/2016  David .................. G03F 7/70625
                                          355/53
2016/0162779 A1* 6/2016  Marcus ................. G06N 20/10
                                          706/12

FOREIGN PATENT DOCUMENTS

JP          3310009 B2      7/2002
KR     10-2015-0018681 A    2/2015

OTHER PUBLICATIONS

Communication dated Jul. 7, 2020, issued by the Japanese Patent Office in counterpart Japanese Application No. 2019-520120.
Chen et al., "Optimal Design Using Neural Network and Information Analysis in Plasma Etching", Journal of Vacuum Science & Technology B, American Vacuum Society, vol. 17, No. 1, Feb. 10, 1999, p. 145-153.
Extended European Search Report dated Apr. 3, 2020, issued by the European Patent Office in counterpart European Patent Application No. 17876302.5.
Kang, Myoung-Soo, "An Empirical Study on Semiconductor Yield Prediction Model using Defect Factor and Artificial Neural Network", Doctoral thesis, Soongsil University, Dec. 31, Dec. 31, 2014, 72 pages.
Office Action for corresponding KR 10-2016-0161315, dated Apr. 19, 2018.
International Search Report for PCT/KR2017/013764, dated Jun. 4, 2018.

* cited by examiner

MACHINE LEARNING-BASED SEMICONDUCTOR MANUFACTURING YIELD PREDICTION SYSTEM AND METHOD

TECHNICAL FIELD

The present disclosure relates to semiconductor manufacturing yield prediction technology, and more particularly, to a system and a method for predicting a final yield based on data generated during a semiconductor manufacturing process.

BACKGROUND ART

To predict a semiconductor manufacturing yield, measurement data obtained after main processes are used. That is, a yield may be predicted by collecting measurement data generated during main processes, and comparing the data and past data.

However, since factors that influence the semiconductor manufacturing yield are very diverse and complicated, there is a problem that the prediction of a yield depending on only measurement data of main processes may reduce accuracy.

Accordingly, there is a demand for a method for exactly predicting a semiconductor manufacturing yield by complexly using a variety of data generated during a semiconductor manufacturing process.

DISCLOSURE

Technical Problem

The present disclosure has been developed in order to address the above-discussed deficiencies of the prior art, and an object of the present disclosure is to provide a method and a system for predicting a result value based on machine learning, which applies different neural network models according to types of data.

Technical Solution

According to an embodiment of the present disclosure to achieve the above-described object, a result prediction method includes: extracting different types of data; training neural network models by classifying the extracted data by type and inputting the classified data to the different neural network models; receiving input of different types of data; and predicting a result value by classifying the inputted data by type and inputting the classified data to the different neural network models.

In addition, the different types of data may be data which are generated during a semiconductor manufacturing process, and the result value may be a semiconductor manufacturing yield.

In addition, the data may be classified into at least two types of data from among production-related data, equipment-related data, fault data, and measurement data.

In addition, one of the fault data and the measurement data may be imaged data.

In addition, the number of types of input data may be less than the number of types of extracted data.

In addition, the receiving the input may include receiving input of different types of data from a system requesting prediction of a result value.

In addition, the extracting may include extracting data periodically, and the receiving the input may include receiving input of data in real time.

In addition, the result prediction method according to an embodiment of the present disclosure may further include: accumulating the extracted data in a storage-based DB; and accumulating the inputted data in a memory-based DB. The training may include classifying the data accumulated in the storage-based DB by type, and inputting the classified data to the different neural network models. The predicting may include classifying the data accumulated in the memory-based DB by time, and inputting the classified data to the different neural network models.

In addition, the predicting may include calculating a prediction value by bagging or boosting result values of the different neural network models.

In addition, the result prediction method according to an embodiment of the present disclosure may further include: selecting some of cause values of the trained neural network models; and generating an integrated neural network model which receives input of the selected cause values.

In addition, the selecting may include selecting some of the cause values based on a correlation with the result values of the trained neural network models.

In addition, the result prediction method according to an embodiment of the present disclosure may further include predicting a result value based on the inputted data by using at least one of the trained neural network models and the integrated neural network model.

According to another embodiment of the present disclosure, a result prediction system includes: an extraction unit configured to extract different types of data; a learning unit configured to train neural network models by classifying the extracted data by type and inputting the classified data to the different neural network models; and a prediction unit configured to receive input of different types of data, and to predict a result value by classifying the inputted data by type and inputting the classified data to the different neural network models.

Advantageous Effects

According to embodiments of the present disclosure as described above, it is possible to exactly predict a result value by ensuring a neural network model of a structure appropriate for characteristics of data by applying different neural network models according to types of data.

In addition, when embodiments of the present disclosure are applied to prediction of a semiconductor manufacturing yield, the flow of processes can be adjusted to enhance productivity/yield, and a fault can be detected early and thus it is possible to take appropriate response in advance.

In addition, when embodiments of the present disclosure are applied to prediction of a semiconductor manufacturing yield, a product that is predicted as not having a good yield can be specially observed/managed, and the yield prediction function can be integrated into a platform and can be used for common use in various manufacturing processes. In addition, various feedback results may be combined and analyzed and thus can be utilized in various fields.

BEST MODE

Hereinafter, the present disclosure will be described in more detail with reference to the drawings.

1. Semiconductor Manufacturing Yield Prediction System

Figure 1:
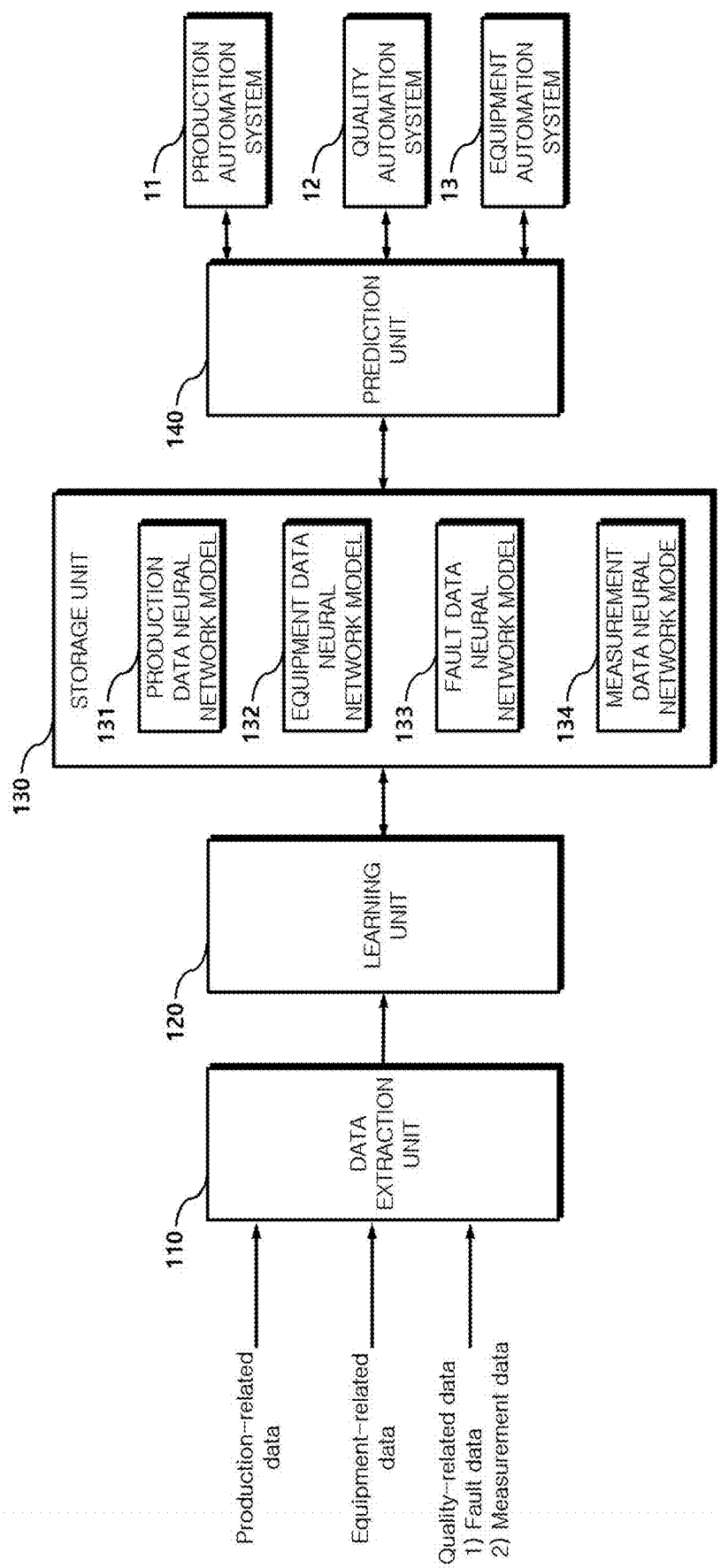
FIG. 1 is a block diagram of a semiconductor manufacturing yield prediction system according to an embodiment of the present disclosure.

FIG. 1 is a block diagram of a semiconductor manufacturing yield prediction system according to an embodiment of the present disclosure. The semiconductor manufacturing yield prediction system according to an embodiment of the present disclosure predicts a semiconductor manufacturing yield by using a neural network model which is generated by machine-learning data generated during a semiconductor manufacturing process.

The neural network models are classified according to types of data. That is, the semiconductor manufacturing yield prediction system according to an embodiment of the present disclosure generates different neural network models according to types of data, and predicts a semiconductor manufacturing yield by complexly using the neural network models.

The semiconductor manufacturing yield prediction system performing the above-described function according to an embodiment of the present disclosure includes a data extraction unit 110, a learning unit 120, a storage unit 130, and a prediction unit 140.

The data extraction unit 110 may extract and accumulate data that should be learned by the learning unit 120, which will be described below, from among various types of data generated during the semiconductor manufacturing process, and may process the data in such a form that the data can be easily learned.

The data extracted by the data extraction unit 110 may be divided into 1) production-related data, 2) equipment-related data, and 3) quality data. The 3) quality-related data may be divided into 31) fault data and 32) measurement data. These types of data will be described below in detail.

Methods for extracting, accumulating, and processing by the data extraction unit 110 may be different according to types of data, and these methods will be described below in detail.

The learning unit 120 repeats a procedure of generating neural network models by performing machine learning with respect to the data extracted/processed by the data extraction unit 110, and of updating the neural network models according to input of additional data.

The neural network models generated/updated by the learning unit 120 are stored in the storage unit 130. Since the neural network models are generated/updated differently according to types of data as described above, the storage unit 130 may include a production data neural network model 131, an equipment data neural network model 132, a fault data neural network model 133, and a measurement data neural network model 134.

The prediction unit 140 predicts a semiconductor manufacturing yield by using the neural network models 131, 132, 133, 134 stored in the storage unit 130. The semiconductor manufacturing yield is predicted when there is a request for prediction of a yield with data from external systems 11, 12, 13, and a result of prediction may be returned to a corresponding external system.

2. Training Data

Data that is extracted, accumulated, and processed by the data extraction unit 110, and then is learned by the learning unit 120 will be described.

The production-related data refers to historical data regarding overall production, in which data regarding a process ID, an equipment ID, a work space in equipment, an equipment work specification ID, etc. performed from a time when the manufacturing of a semiconductor starts until a present time are arranged in time series.

The equipment-related data refers to data which is measured through an internal/external sensor in equipment during processes from the time when the manufacturing of the semiconductor starts until the present time, such as an equipment operating time, temperature, pressure, the number of vibrations, a ratio of a specific material, or the like. That is, the equipment-related data may be referred to as input data regarding operating/state of equipment in which various physical/electrical state values regarding equipment are arranged in time series.

The quality data refers to data which is obtained by measuring quality of an intermediate product from the time when the manufacturing of the semiconductor starts until the present time, and may be divided into fault data and measurement data.

The fault data refers to data indicating the number of faults, a fault size, a fault position, a fault shape, or the like. The fault data may be image data or may use text data.

The measurement data refers to data indicating a line width, thickness, and misalignment of a circuit. Like the fault data, the measurement data may use text data as well as image data.

3. Extraction of Data

The extraction of data may be divided into extraction of training data and extraction of input data. The former is to extract data to be learned by the learning unit 120 and may be performed by a periodic extraction method. The latter is to extract data generated at the present time when the prediction unit 140 intends to predict a semiconductor yield, and may be performed by a real-time extraction method.

The periodic extraction method is a method in which the data extraction unit 110 inquires about data stored in various repositories of the semiconductor manufacturing system, for example, a relational database management system (RDBMS), a data warehouse, a Hadoop distributed file system (HDFS), a file, or the like, by using a structural query language (SQL), and extracts data periodically (on a monthly, weekly, daily, hourly, minutely, or second basis).

The real-time extraction method is a method in which the prediction unit 140 receives data generated in the semiconductor manufacturing system in real time through a pre-associated messaging system before the data is stored in a corresponding system, for example, in a physical repository of the external system 11, 12, 13.

4. Accumulation of Training Data

The training data extracted by the data extraction unit 110 is accumulated in a storage-based repository provided in the data extraction unit 110, for example, an RDBMS, a data warehouse, an HDFS, a file, or the like.

On the other hand, the input data received in real time for prediction of a semiconductor yield is accumulated in an in-memory database (DB) provided in the prediction unit. The in-memory DB may query about a memory block rapidly in an index method and may obtain data.

5. Processing of Data

The data is processed by the data extraction unit 110 and the prediction unit 140 to be converted into data appropriate to be inputted to the neural network models, and the data processing may be performed differently according to data characteristics.

Specifically, in the case of time-series data of a long period, the data may be processed into an average value of an analysis unit period to be reduced according to the analysis unit period. For example, millions of equipment numerical values generated for one day may be replaced with one average value.

In addition, regarding categorical data, a unique set for all categories may be obtained, and a 0 matrix having as many columns as the number of categories and as many rows as the number of data may be made. Then, only a value in a corresponding column of a row of corresponding data may be replaced with 1.

In addition, regarding numerical data, a scale may be adjusted to a real number (float) value ranging from 0 to 1 or from −1 to 1. The scale adjustment may be achieved by obtaining a minimum value and a maximum value of a data set, converting the minimum value and the maximum value to 0 and 1 or −1 and 1, respectively, and converting the other values according to a ratio.

6. Generation/Updating/Storing of Neutral Network Models by Learning Data

Machine learning by the learning unit 120 is separately performed according to types of data, and separate neural network models are generated/updated according to types of resulting data. Hereinafter, a method for generating/updating neutral network models will be described according to types of data.

6.1 Production Data Neural Network Model

The learning unit 120 may train the production data neural network model 131 by inputting, as a cause value (X), historical data regarding overall production, such as time-series data regarding a process ID, an equipment ID, a work space in equipment, an equipment work specification ID, or the like, to an input node of the production data neural network model 131, and by positioning, as an effect value (Y), a real semiconductor manufacturing yield value at an output node of the production data neural network model 131.

As a neural network processing technique to train the production data neural network model 131, an extended form of a recurrent neural network (RNN), such as a long short term memory (LSTM), which is able to process time-series data, may be used.

Figure 2:
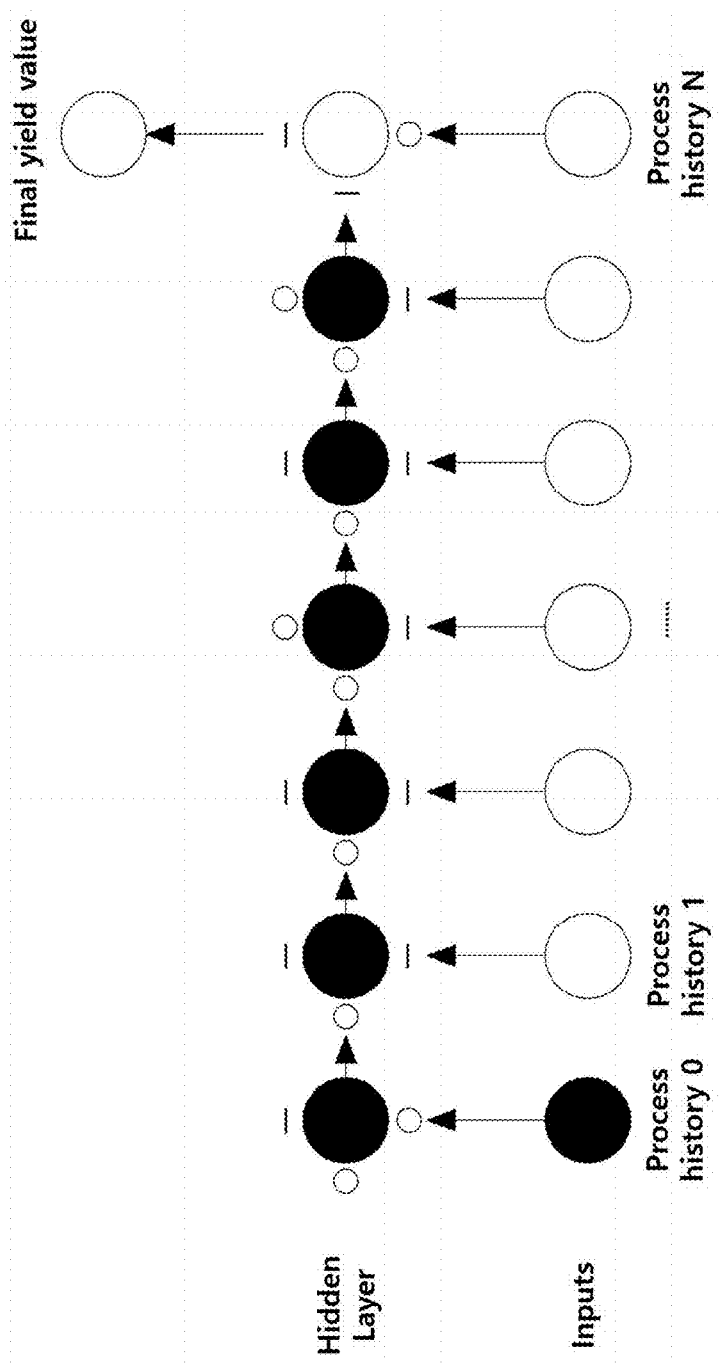
FIG. 2 is a view illustrating an example of a structure of a production data neural network model.

FIG. 2 illustrates an example of a structure of the production data neural network model 131.

6.2 Equipment Data Neural Network Model

The learning unit 120 may train the equipment data neural network model 132 by inputting, as a cause value (X), time-series operating/state data of equipment measured through an internal/external sensor of the equipment, such as an equipment operating time, temperature, pressure, the number of vibrations, a ratio of a specific material, or the like, to an input node of the equipment data neural network model 132, and by positioning, as an effect value (Y), a real semiconductor manufacturing yield value at an output node of the equipment data neural network model 1132.

As a neural network processing technique to train the equipment data neural network model 132, an extended form of an RNN such as an LSTM may be used.

Figure 3:
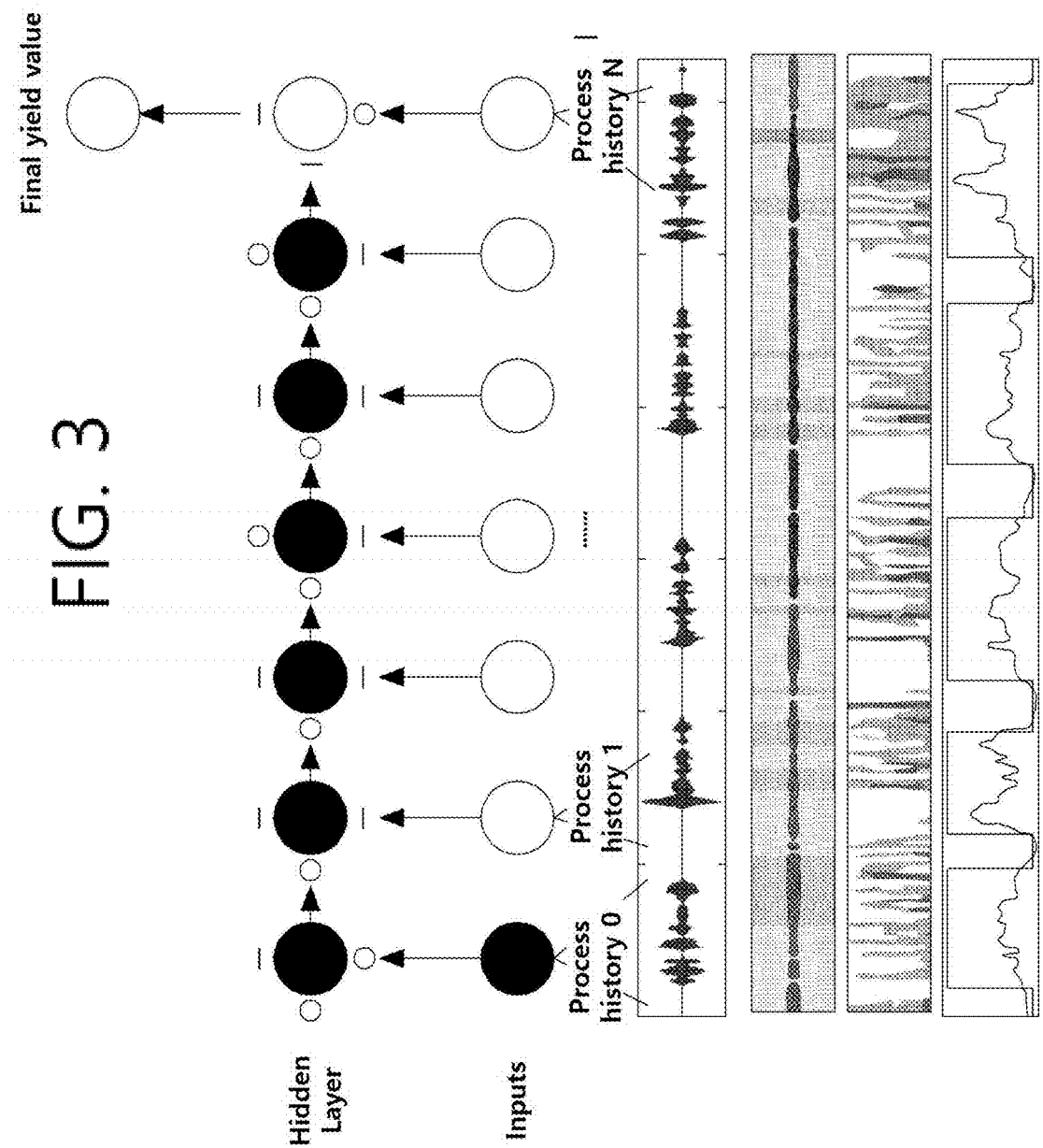
FIG. 3 is a view illustrating an example of a structure of an equipment data neural network model.

FIG. 3 illustrates an example of a structure of the equipment data neural network model 132.

6.3 Fault Data Neural Network Model

The learning unit 120 may train the fault data neural network model 133 by inputting, as a cause value (X), imaged fault data indicating the number of faults, a fault size, a fault position, a fault shape, or the like, to an input node of the fault data neural network model 133, and by positioning, as an effect value (Y), a real semiconductor manufacturing yield value at an output node of the fault data neural network model 133.

As a neural network processing technique to train the fault data neural network model 133, an extended form of a convolutional neural network (CNN) which is able to process image data may be used.

Figure 4:
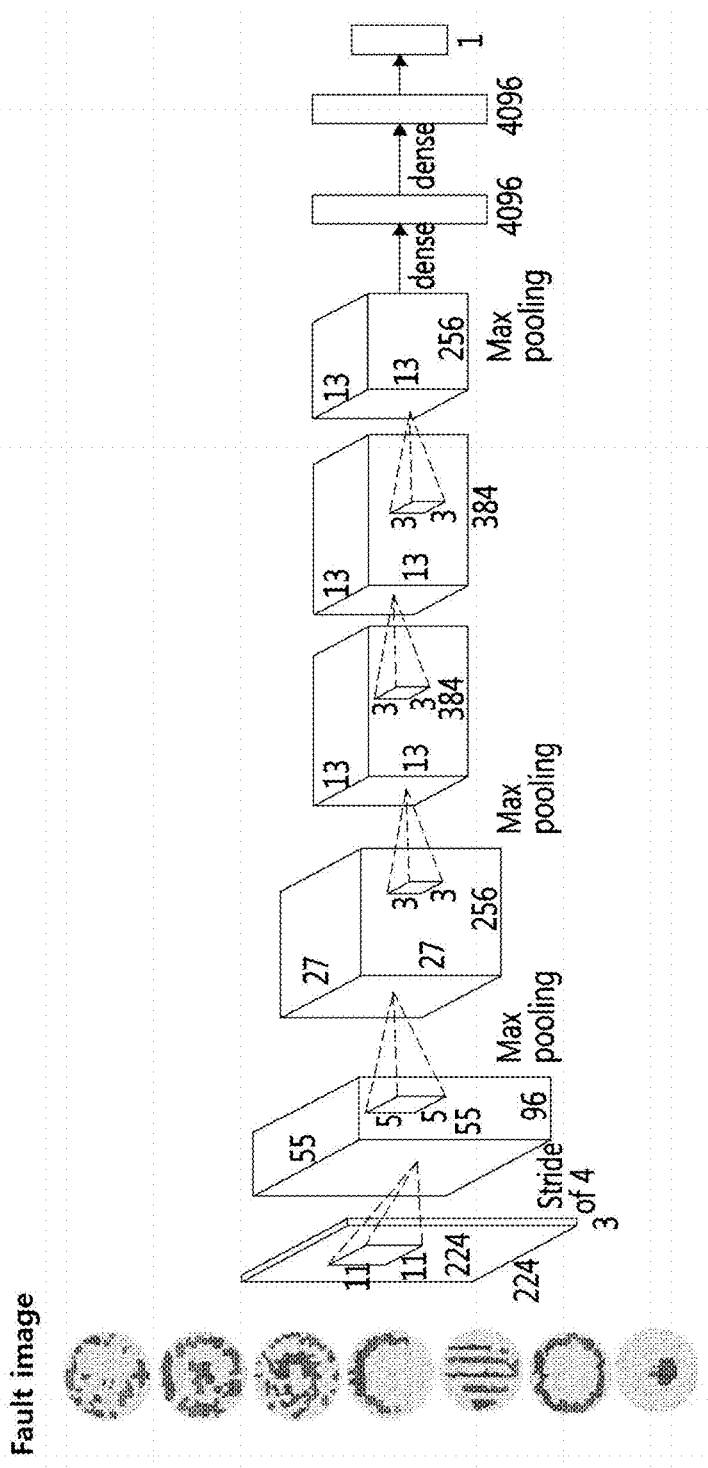
FIG. 4 is a view illustrating an example of a structure of a fault data neural network model.

FIG. 4 illustrates an example of a structure of the fault data neural network model 133.

6.4 Measurement Data Neural Network Model

The learning unit 120 may train the measurement data neural network model 134 by inputting, as a cause value (X), imaged or time-series measurement data indicating a line width, thickness, and misalignment of a circuit to an input node of the measurement data neural network model 134, and by positioning, as an effect value (Y), a real semiconductor manufacturing yield value at an output node of the measurement data neural network model 134.

As a neural network processing technique to train the measurement data neural network model 145, an extended form of a CNN which is able to process image data, or an extended form of an RNN such as an LSTM may be used.

7. Prediction of a Semiconductor Manufacturing Yield

The external systems 11, 12, 13 may provide the above-described input data to the semiconductor manufacturing yield prediction system, and may request the system to predict a semiconductor manufacturing yield. Herein, the input data corresponds to cause values (X) inputted to the input nodes of the neural network models 131, 132, 133, 134, and includes an entirety/part of the production-related data, the equipment-related data, the quality data, and the fault data.

Furthermore, the input data provided by the external systems 11, 12, 13 may include only a part of each type of data. For example, the data provided by the external systems 11, 12, 13 may include only data regarding the process ID and the equipment ID from among the production-related data (data regarding the process ID, the equipment ID, the work space in equipment, the equipment work specification ID, or the like).

The input data provided by the external systems 11, 12, 13 may be accumulated in the in-memory DB provided in the prediction unit 140.

The prediction unit 140 inputs the input data accumulated in the in-memory DB as a cause value (X) of the neural network model 131, 132, 133, 134, and obtains an effect value (Y) of the output node of the neural network model 131, 132, 133, 134.

The prediction unit 140 predicts a semiconductor manufacturing yield value by using the effect values (Y). Two or more types of data may be provided by the external systems 11, 12, 13, and thus two or more neural network models 131, 132, 133, 134 may be used and two or more effect values (Y) may be obtained. In this case, the prediction unit 140 may predict a semiconductor manufacturing yield value by bagging or boosting the effect values.

The predicted semiconductor manufacturing yield value is returned to the external systems 11, 12, 13 from the prediction unit 140. The external systems 11, 12, 13 are systems for automating a semiconductor manufacturing process, and can efficiently manage the process in real time based on the predicted semiconductor manufacturing yield.

In particular, since it is possible to predict the whole manufacturing yield only with sample data, measurement requiring much cost/time in the semiconductor manufacturing process can be minimized.

8. Integrated Neural Network Model

Figure 5:
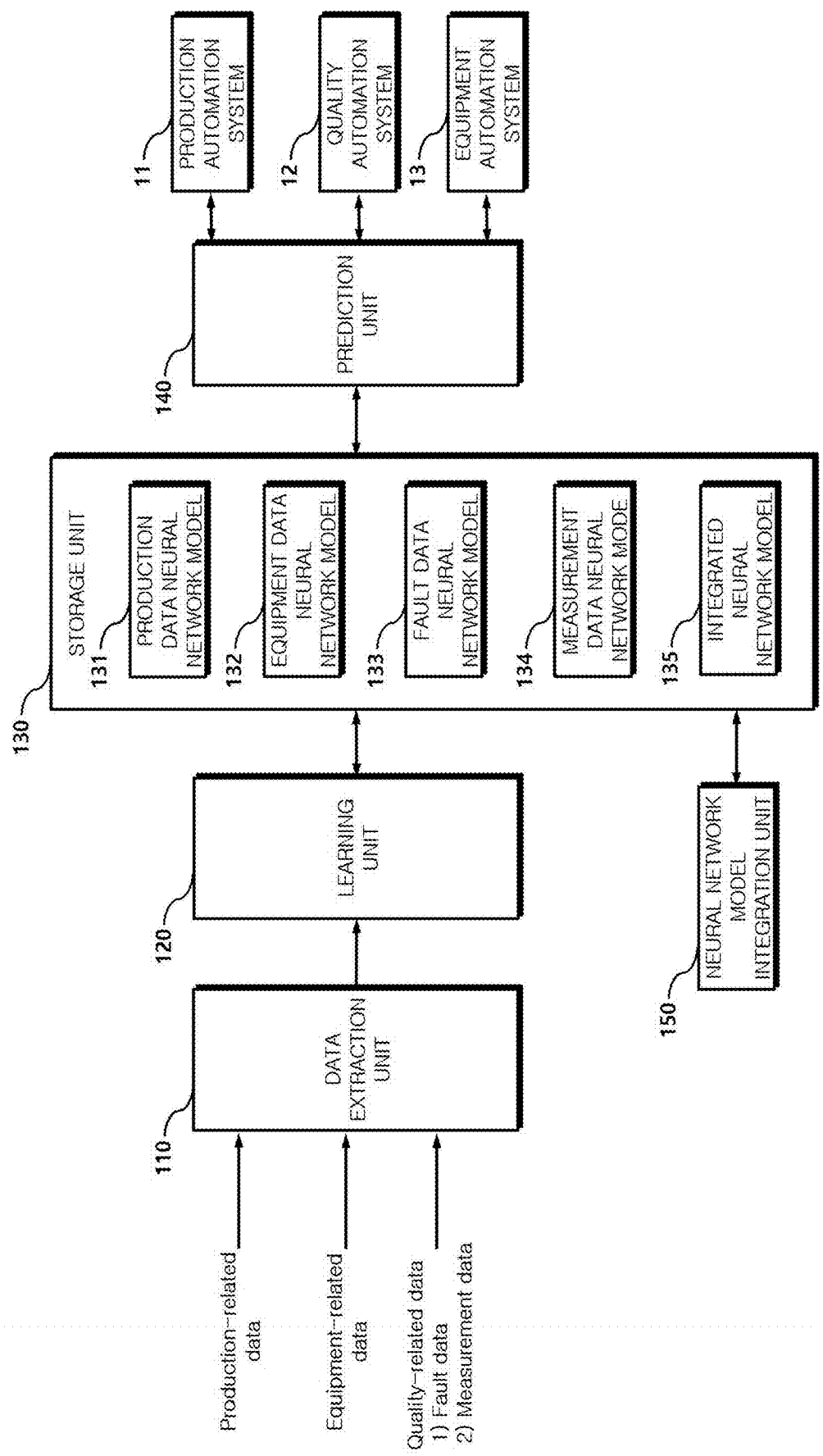
FIG. 5 is a block diagram of a semiconductor manufacturing yield prediction system according to another embodiment of the present disclosure.

FIG. 5 is a block diagram of a semiconductor manufacturing yield prediction system according to another embodiment of the present disclosure. The semiconductor manufacturing yield prediction system according to an embodiment of the present disclosure may include a neural network model integration unit 150 to process/integrate the neural network models 131, 132, 133, 134 stored in the storage unit 130, and to generate a single integrated neural network model 135.

The neural network model integration unit 150 selects a cause value (X) having a high correlation with an effect value (Y) with respect to each of the neural network models 131, 132, 133, 134, and generates the integrated neural network model 135 which receives the selected cause value (X) through an input node, and outputs an effect value (Y).

For example, the following situations are assumed:

1) a situation in which values regarding the equipment ID and the work space in equipment from among the cause values (X) of the production data neural network model 131 have a high correlation with the real semiconductor manufacturing yield value which is the effect value (Y);

2) a situation in which values regarding temperature and pressure from among the cause values (X) of the equipment data neural network model 132 have a high correlation with the real semiconductor manufacturing yield value which is the effect value (Y);

3) a situation in which values regarding the fault size and the fault position from among the cause values (X) of the fault data neural network model 133 have a high correlation with the real semiconductor manufacturing yield value which is the effect value (Y); and 4) a situation in which values regarding the line width and the misalignment from among the cause values (X) of the measurement data neural network model 134 have a high correlation with the real semiconductor manufacturing yield value which is the effect value (Y).

In this case, the neural network model integration unit 150 may generate the integrated neural network model 135 which receives the values regarding the equipment ID, the work space in equipment, the temperature, the pressure, the fault size, the fault position, the line width, and the misalignment, as the cause values (X) through the input node, and positions the effect value (Y), which is the semiconductor manufacturing yield value, at the output node, and may update the integrated neural network model 135 by learning.

The prediction unit 140 may predict the semiconductor manufacturing yield by using the integrated neural network model 135, and also, may predict the semiconductor manufacturing yield value by bagging or boosting the effect values Y from the entirety/part of the neural network models 131, 132, 133, 134, 135, by complexly considering the integrated neural network model 135 and the other neural network models 131, 132, 133, 134.

9. Variations

Up to now, the machine learning-based semiconductor manufacturing yield prediction system and method have been described in detail with reference to preferred embodiments.

The data and the machine learning techniques mentioned in the above-described embodiments are merely examples, and may be replaced with others.

Furthermore, the prediction of the semiconductor manufacturing yield is merely an embodiment of the technical idea of the present disclosure. The technical idea of the present disclosure may be applied to the prediction of other data, in addition to the prediction of the semiconductor manufacturing yield.

The technical idea of the present disclosure may be applied to a computer-readable recording medium which records a computer program for performing the functions of the apparatus and the method according to the present embodiment. In addition, the technical idea according to various embodiments of the present disclosure may be implemented in the form of a computer-readable code recorded on the computer-readable recording medium. The computer-readable recording medium may be any data storage device that can be read by a computer and can store data. For example, the computer-readable recording medium may be a read only memory (ROM), a random access memory (RAM), a CD-ROM, a magnetic tape, a floppy disk, an optical disk, a hard disk drive, or the like. A computer-readable code or program that is stored in the computer readable recording medium may be transmitted via a network connected between computers.

In addition, while preferred embodiments of the present disclosure have been illustrated and described, the present disclosure is not limited to the above-described specific embodiments. Various changes can be made by a person skilled in the art without departing from the scope of the present disclosure claimed in claims, and also, changed embodiments should not be understood as being separate from the technical idea or prospect of the present disclosure.

The invention claimed is:

1. A result prediction method, comprising:
   extracting different types of first data generated during a manufacturing process of a semiconductor;
   training different neural network models by classifying the extracted first data by type and inputting the classified first data to the different neural network models;
   receiving input of different types of second data; and
   predicting a result value by classifying the inputted second data by type and inputting the classified second data to the different neural network models, the result value being a semiconductor manufacturing yield,
   wherein the different neural network models include a production data neural network model, an equipment data neural network model, a fault data neural network model and a measurement data neural network model, and
   wherein the training of the different neural network models comprises training the production data neural network model, the equipment data neural network model, the fault data neural network model and the measurement data neural network model by classifying the extracted first data into production-related data, equipment-related data, fault data, and measurement data, and inputting the production-related data, the equipment-related data, the fault data, the measurement data to the production data neural network model, the equipment data neural network model, the fault data neural network model and the measurement data neural network model, respectively.

2. The method of claim 1, wherein the production-related data includes data regarding production of the semiconductor from start of the manufacturing process of the semiconductor starts to a specific time in the manufacturing process of the semiconductor, and wherein the equipment-related data includes data measured through a sensor in equipment for manufacturing the semiconductor from the start of the manufacturing process of the semiconductor starts to the specific time, and wherein the fault data includes data indicating the number of faults, a fault size, a fault position, or a fault shape, wherein the measurement data includes data indicating a line width, thickness, or misalignment of a circuit, and wherein the fault data and the measurement data are included in quality data obtained by measuring quality of an intermediate product from the start of the manufacturing of the semiconductor to the specific time.

3. The method of claim 1, wherein one of the fault data and the measurement data is imaged data.

4. The method of claim 1, wherein the number of types of input the second data is less than the number of types of the extracted first data.

5. The method of claim 1, wherein the receiving the input of the different types of second data comprises receiving input of different types of data from a system requesting prediction of the result value.

6. The method of claim 5, wherein the extracting comprises extracting data periodically, and wherein the receiving the input of the different types of second data comprises receiving input of data in real time.

7. The method of claim 6, further comprising:

accumulating the extracted first data in a storage-based DB; and accumulating the inputted second data in a memory-based DB, wherein the training comprises classifying the first data accumulated in the storage-based DB by type, and inputting the classified first data to the different neural network models, wherein the predicting comprises classifying the second data accumulated in the memory-based DB by time, and inputting the classified second data to the different neural network models.

8. The method of claim 1, wherein the predicting comprises calculating a prediction value by bagging or boosting result values of the different neural network models.

9. The method of claim 1, further comprising:

selecting some of input values of the trained neural network models; and generating an integrated neural network model which receives input of the selected input values.

10. The method of claim 9, wherein the selecting comprises selecting some of the input values based on a correlation with the result values of the trained neural network models.

11. The method of claim 9, further comprising predicting the result value based on the inputted second data by using at least one of the trained neural network models and the integrated neural network model.

12. A result prediction system, comprising:
a processor; and
a memory storing instructions executable by the processor,
wherein the processor is configured to:
extract different types of first data generated during a manufacturing process of a semiconductor;
train different neural network models by classifying the extracted first data by type and inputting the classified first data to the different neural network models; and
receive input of different types of second data, and to predict a result value by classifying the inputted second data by type and inputting the classified second data to the different neural network models, the result value being a semiconductor manufacturing yield,
wherein the different neural network models include a production data neural network model, an equipment data neural network model, a fault data neural network model and a measurement data neural network model,
wherein the processor is further configured to train the production data neural network model, the equipment data neural network model, the fault data neural network model and the measurement data neural network model by classifying the extracted first data into production-related data, equipment-related data, fault data, and measurement data, and inputting the production-related data, the equipment-related data, the fault data, the measurement data to the production data neural network model, the equipment data neural network model, the fault data neural network model and the measurement data neural network model, respectively.

13. The system of claim 12, wherein the processor is further configured to select some of input values of the trained neural network models and generate an integrated neural network model which receives input of the selected input values.

14. The system of claim 13, wherein the processor is further configured to select some of the input values based on a correlation with result values of the trained neural network models.

15. The system of claim 14, the processor is further configured to predict the result value based on the inputted second data by using at least one of the trained neural network models and the integrated neural network model.

16. The system of claim 12, wherein the production-related data includes data regarding production of the semiconductor from start of the manufacturing process of the semiconductor starts to a specific time in the manufacturing process of the semiconductor, and wherein the equipment-related data includes data measured through a sensor in equipment for manufacturing the semiconductor from the start of the manufacturing process of the semiconductor starts to the specific time, and wherein the fault data includes data indicating the number of faults, a fault size, a fault position, or a fault shape, wherein the measurement data includes data indicating a line width, thickness, or misalignment of a circuit, and wherein the fault data and the measurement data are included in quality data obtained by measuring quality of an intermediate product from the start of the manufacturing of the semiconductor to the specific time.

* * * * *